United States Patent
Rori et al.

(10) Patent No.: US 10,877,687 B2
(45) Date of Patent: Dec. 29, 2020

(54) ERASURE OF MULTIPLE BLOCKS IN MEMORY DEVICES

(71) Applicant: Micron Technology, Inc., Boise, ID (US)

(72) Inventors: Fulvio Rori, Boise, ID (US); Giuseppe Cariello, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/024,428

(22) Filed: Jun. 29, 2018

(65) Prior Publication Data

US 2020/0004453 A1     Jan. 2, 2020

(51) Int. Cl.
    *G06F 3/06*        (2006.01)
    *G06F 12/02*      (2006.01)
    *G11C 16/34*      (2006.01)
    *G11C 16/16*      (2006.01)

(52) U.S. Cl.
CPC .......... *G06F 3/0652* (2013.01); *G06F 3/0604* (2013.01); *G06F 3/0679* (2013.01); *G06F 3/0688* (2013.01); *G06F 12/0246* (2013.01); *G06F 2212/7205* (2013.01); *G11C 16/16* (2013.01); *G11C 16/345* (2013.01)

(58) Field of Classification Search
CPC . G11C 16/16; G11C 11/5635; G11C 16/3445; G11C 16/344; G06F 3/0679; G06F 12/0246; G06F 3/0659; G06F 3/0688; G06F 3/064; G06F 3/0652; G06F 2212/7205
See application file for complete search history.

(56) References Cited

U.S. PATENT DOCUMENTS

| | | | |
|---|---|---|---|
| 7,293,154 B1 * | 11/2007 | Karr ................... | G06F 11/2082 711/202 |
| 2008/0031061 A1 * | 2/2008 | Roohparvar ........... | G11C 29/88 365/200 |
| 2014/0173183 A1 * | 6/2014 | Shin .................... | G06F 12/0246 711/103 |
| 2018/0102172 A1 * | 4/2018 | Yi ........................ | G11C 8/12 |

* cited by examiner

*Primary Examiner* — Reginald G Bragdon
*Assistant Examiner* — Than D Vo
(74) *Attorney, Agent, or Firm* — Schwegman Lundberg & Woessner, P.A.

(57) ABSTRACT

A variety of applications can include memory systems that have one or more memory devices capable of performing memory operations on multiple blocks of memory in response to a command from a host. For example, improvement in erase performance can be attained by erasing multiple blocks of memory by one of a number of approaches. Such approaches can include parallel erasure followed by serial verification in response to a single command. Other approaches can include sequential erase and verify operations of the multiple blocks in response to a single command. Additional apparatus, systems, and methods are disclosed.

12 Claims, 10 Drawing Sheets

ERASURE OF MULTIPLE BLOCKS IN MEMORY DEVICES

BACKGROUND

Memory devices are typically provided as internal, semiconductor, integrated circuits in computers or other electronic devices. There are many different types of memory, including volatile and non-volatile memory. Volatile memory requires power to maintain its data, and examples of volatile memory include random-access memory (RAM), dynamic random-access memory (DRAM), and synchronous dynamic random-access memory (SDRAM), among others. Non-volatile memory can retain stored data when not powered, and examples of non-volatile memory include flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), and three-dimensional (3D) XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include negative-and (NAND) and negative-or (NOR) architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the memory cells in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series-coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context to can refer to any memory cell that can store more than one bit of data per cell (i.e., that can represent more than two programmed states).

Traditional memory arrays are two-dimensional (2D) structures arranged on a surface of a semiconductor substrate and can be referred to as a planar memory array. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storages cells of the string. In the example of a vertical string, the polysilicon structure may be in the form of a vertically extending pillar. In some examples, the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. A SSD can be used as, among other things, the main storage device of a computer, having benefits over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells, to obviate internal battery supply requirements, thus allowing the drive to be more versatile and compact.

A SSD can include a number of memory devices, including a number of dies or logical units (e.g., logical unit numbers or LUNs), and can include one or more processors or other controllers performing logic functions required to operate the memory devices or interface with external systems. Such SSDs may include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

To perform an operation in a memory device, there is an amount time associated with completing the operation. The longer a single operation of a memory device takes to perform its task, the slower an application, which uses the memory device, runs. Thus, the memory industry is driven to structure memory devices to perform operations in a manner to reduce time for as many memory operations as possible.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1:
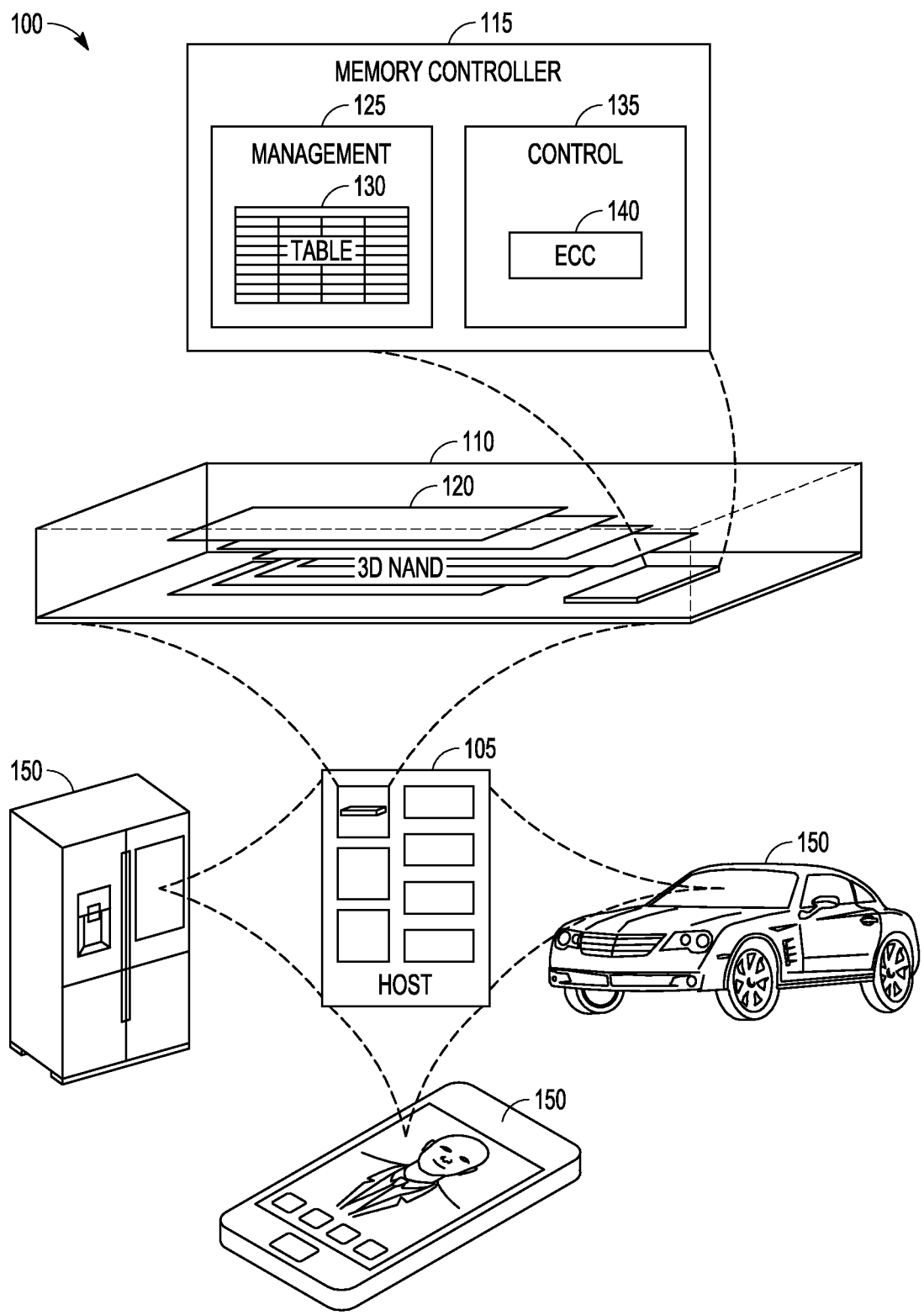
FIG. 1 illustrates an example of an environment including a memory device, according to various embodiments.

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments, improvements of memory device capability can be attained by reducing the time that it takes for the memory device to perform functions associated with the storage elements of the memory device by performing the function on multiple storage elements of the memory device using a single command. For example, improvement in erase performance can be attained by erasing multiple blocks of memory in a number of approaches with respect to a multi-block erase (MBE) and with respect to a chip erasure (CE). Each of these operational approaches can include parallel erasure in response to a single command or sequential erase operation in response to a single command. These approaches can be implemented in a number of different algorithms. An algorithm basically is a procedure for accomplishing a task based on conducting a number of specified actions. These algorithms can be executed using firmware for operation in the memory device.

A range MBE (RMBE) provides a method to erase a set of contiguous blocks of memory within start and stop limits. A list MBE (LMBE) provides a method to erase a set of blocks of memory within a list of blocks. The CE of a memory device provides a method to erase all storage elements of the memory device that are user accessible, where storage elements for maintenance and operation of the memory device are effectively masked from an erase operation. These storage elements may be configured as an array of memory elements. An implementation algorithm of these methods can include performing an erase and verify operation sequentially on each block in the range for RMBE, in the list for LMBE, or in the user available blocks of the memory device for CE. Another implementation algorithm of these methods can include issuing an erase pulse in parallel on all the blocks in the range for RMBE, in the list for LMBE, or in the user available blocks of the memory device for CE. After the pulse, the blocks can be sequentially verified, where the blocks that pass the verify are inhibited from receiving an extra pulse. The inhibit operation can include the use of a tag for a block that passes the verify operation. The MBE and CE algorithms can be enabled and managed using a feature address (FA).

Systems implementing these algorithms, or similar algorithms, can experience latency improvement with respect to user mode commands. For example, execution time can be reduced for a wipe device command, where all blocks in the user area of the memory device are erased at once. In another example, execution time can be reduced for a purge command, a sanitize command, or a secure erase, where all blocks in a garbage list are erased at once. In addition, performance improvement in write workload can be attained with the memory device in a memory system whose memory device capacity is full. Firmware associated with such a memory system can accumulate few garbage blocks and erase them in parallel.

These algorithms, or similar algorithms, to erase multiple blocks of memory provide for ease of implementation in memory-based systems. Execution of these algorithms to erase multiple blocks of memory in a system can be executed, using firmware, in response to a single command instead of a sequence of commands. This can be especially useful in early software development phase or on testers with a slow interface and/or sequential access to devices under test (DUTs). With the memory system having multiple memory devices structured as NAND memory devices, these algorithms coded in a firmware for the memory system can offload tasks of a host of the memory system to manage different NAND geometries. This property can be useful for ROM implementation in managed NAND applications. A command for the CE, taught herein, can have hardcoded values for first and last blocks in a NAND.

These algorithms, or similar algorithms, to erase multiple blocks of memory in a system, using firmware associated with a memory controller, can include erase verification (EV) as part of the algorithm, which effectively enabled the EV before the erase option is executed. This can significantly reduce the task of the associated host to keep track of the block state. This effective enablement before the erase option can provide for fast automatic check and mitigation of charge gain. These algorithms, or similar algorithms, allow for the ease of implementation of cycling flows alternating erase and preconditioning phases.

These algorithms, or similar algorithms, to erase multiple blocks of memory in a system, using firmware associated with a memory controller, can provide test time improvement in manufacturing and engineering test flows. For example, manufacturing and engineering can be performed with a NAND memory system reset to factory settings and including NAND cycling. The MBE approach including applying an erase pulse in parallel provided higher parallelism in the erase phase than conventional approaches. This approach can provide an estimated improvement of 40% with respect to a memory array of floating gate NANDs (FG-NANDs). This approach can provide an estimated improvement of 90% with respect to a memory array of replacement gate NANDs (RG-NAND).

These algorithms, or similar algorithms, to erase multiple blocks of memory in a system, using firmware associated with a memory controller, can provide less traffic on a memory system bus. The memory bus for a NAND based memory system can use an open NAND flash interface (ONFI). Less ONFI traffic can be associated with an estimated improvement of 2-10%, depending on tester speed.

These algorithms, or similar algorithms, to erase multiple blocks of memory in a system can provide improved synchronization in a multi-die environment. This can be due to variation of times for block erase (tBERS) across blocks. When issuing a single block erase command, a host waits on the slower die for each block and wastes cycles encountering bad blocks. Using MBE or CE approaches using corresponding MBE or CE commands, erase times are automatically averaged at the die level, which can provide an estimated improvement of 2-10%.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., Internet-of-Things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor, or one or more transceiver circuits, etc.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host device 105 may be a machine having some portion, or all, of the components discussed in reference to the machine 500 of FIG. 5.

The memory controller 115 can receive instructions from the host device 105, and can communicate with the memory array 120, such as to transfer data to (e.g., write or erase) or from (e.g., read) one or more of the memory cells, planes, sub-blocks, blocks, or pages of the memory array 120. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host device 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array 120 or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host device 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host device 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and four or more planes per device. As another example, a 32 GB MLC memory device (storing two bits of data per cell (i.e., four programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the memory device 110 in pages, and erased in blocks. However, one or more memory operations (e.g., read, write, erase, etc.) can be performed on larger or smaller groups of memory cells, as desired. The data transfer size of a memory device 110 is typically referred to as a page; whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
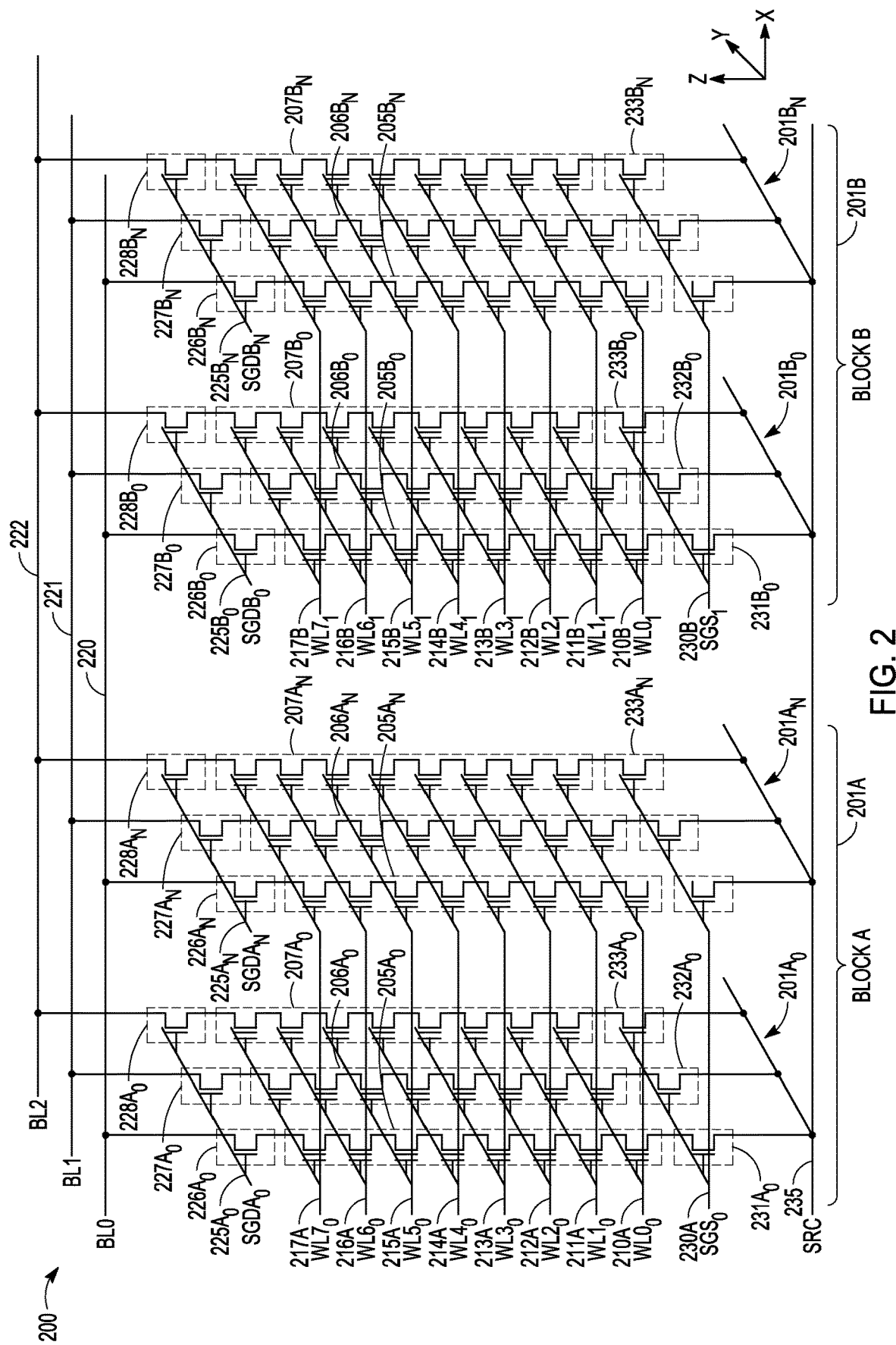
FIGS. 2 and 3 illustrate schematic diagrams of an example of a three-dimensional NAND architecture semiconductor memory array, according to various embodiments.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ 201$A_0$, sub-block $A_n$ 201$A_n$, sub-block $B_0$ 201$B_0$, sub-block $B_n$ 201$B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array 200 can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and four or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array 200, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ $225A_0$, first-third $A_n$ SGD $226A_n$-$228A_n$ can be accessed using an $A_n$ SGD line $SGDA_n$ $225A_n$, first-third $B_0$ SGD $226B_0$-$228B_0$ can be accessed using a $B_0$ SGD line $SGDB_0$ $225B_0$, and first-third $B_n$ SGD $226B_n$-$228B_n$ can be accessed using a $B_n$ SGD line $SGDB_n$ $225B_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
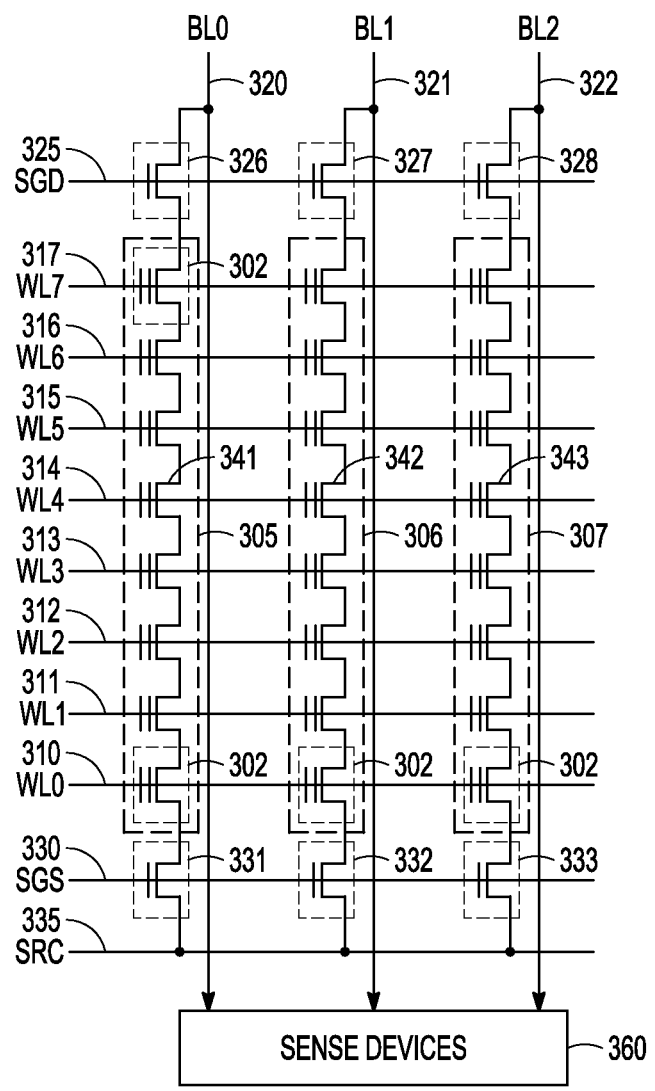

FIG. 3 illustrates an example schematic diagram of a portion of a NAND architecture semiconductor memory array including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) 335 using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers or devices 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
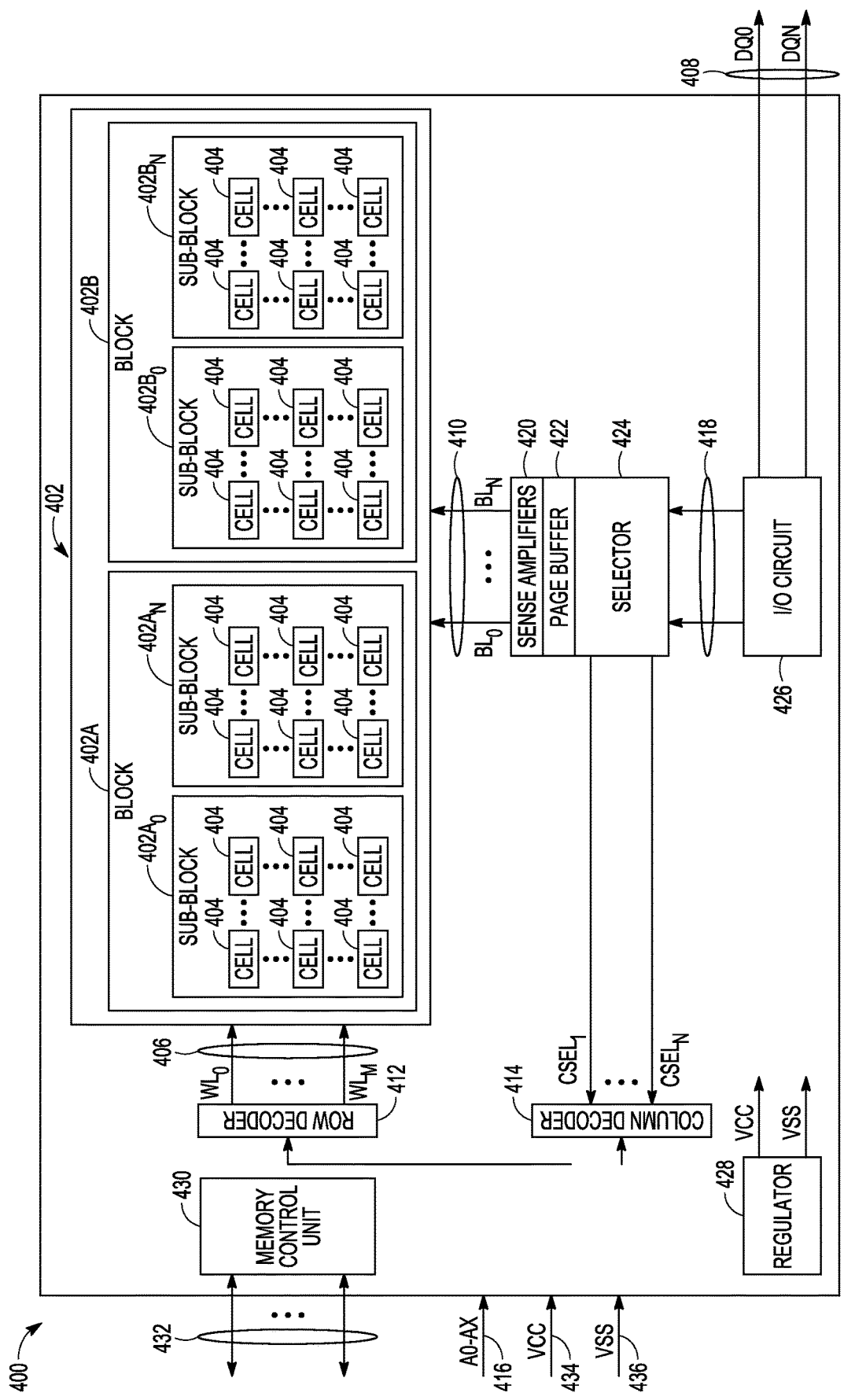
FIG. 4 illustrates an example block diagram of a memory module, according to various embodiments.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

Figure 5:
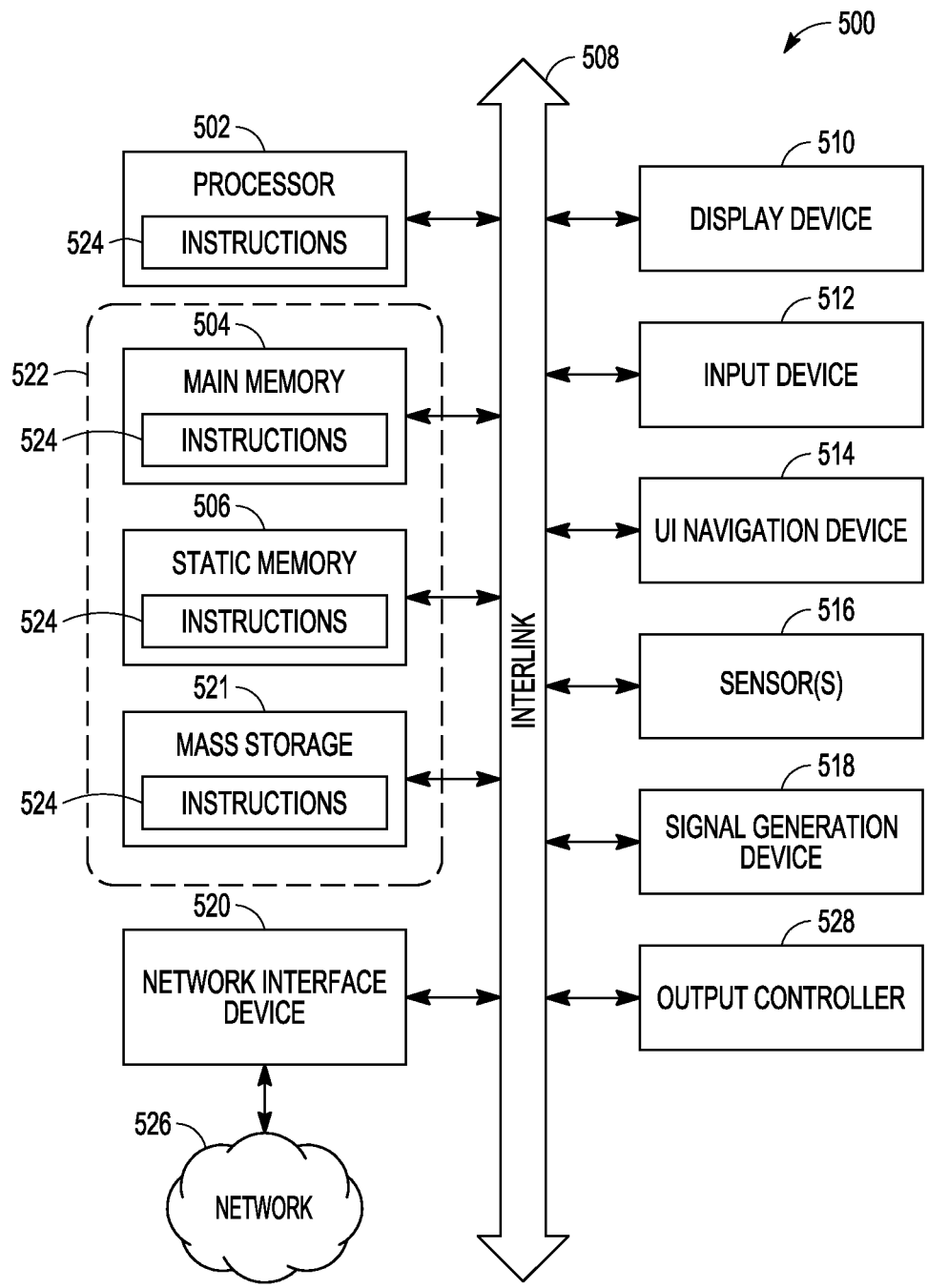
FIG. 5 is a block diagram illustrating an example machine upon which one or more embodiments may be implemented, according to various embodiments.

FIG. 5 illustrates a block diagram of an example machine 500 upon which any one or more of the techniques (e.g., methodologies) discussed herein may perform. In alternative embodiments, the machine 500 may operate as a standalone device or may be connected (e.g., networked) to other machines. In a networked deployment, the machine 500 may operate in the capacity of a server machine, a client machine, or both in server-client network environments. In an example, the machine 500 may act as a peer machine in peer-to-peer (P2P) (or other distributed) network environment. The machine 500 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 500 (e.g., the host device 105, the memory device 110, etc.) may include a hardware processor 502 (e.g., a central processing unit (CPU), a graphics processing unit (GPU), a hardware processor core, or any combination thereof, such as the memory controller 115, etc.), a main memory 504 and a static memory 506, some or all of which may communicate with each other via an interlink (e.g., bus) 508. The machine 500 may further include a display unit 510, an alphanumeric input device 512 (e.g., a keyboard), and a user interface (UI) navigation device 514 (e.g., a mouse). In an example, the display unit 510, input device 512 and UI navigation device 514 may be a touch screen display. The machine 500 may additionally include a storage device (e.g., drive unit) 521, a signal generation device 518 (e.g., a speaker), a network interface device 520, and one or more sensors 516, such as a global positioning system (GPS) sensor, compass, accelerometer, or other sensor. The machine 500 may include an output controller 528, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 521 may include a machine-readable medium 522 on which is stored one or more sets of data structures or instructions 524 (e.g., software) embodying or utilized by any one or more of the techniques or functions described herein. The instructions 524 may also reside, completely or at least partially, within the main memory 504, within static memory 506, or within the hardware processor 502 during execution thereof by the machine 500. In an example, one or any combination of the hardware processor 502, the main memory 504, the static memory 506, or the storage device 521 may constitute the machine readable-medium 522.

While the machine-readable medium 522 is illustrated as a single medium, the term "machine readable medium" may include a single medium or multiple media (e.g., a centralized or distributed database, or associated caches and servers) configured to store the one or more instructions 524.

The term "machine readable medium" may include any medium that is capable of storing, encoding, or carrying instructions for execution by the machine 500 and that cause the machine 500 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 524 (e.g., software, programs, an operating system (OS), etc.) or other data, which are stored on the storage device 521, can be accessed by the memory 504 for use by the processor 502. The memory 504 (e.g., DRAM) is typically fast, but volatile, and thus a different type of storage than the storage device 521 (e.g., an SSD), which is suitable for long-term storage, including while in an "off" condition. The instructions 524 or data in use by a user or the machine 500 are typically loaded in the memory 504 for use by the processor 502. When the memory 504 is full, virtual space from the storage device 521 can be allocated to supplement the memory 504; however, because the storage device 521 is typically slower than the memory 504, and write speeds are typically at least twice as slow as read speeds, use of virtual memory can greatly reduce user experience due to storage device latency (in contrast to the memory 504, e.g., DRAM). Further, use of the storage device 521 for virtual memory can greatly reduce the usable lifespan of the storage device 521.

In contrast to virtual memory, virtual memory compression (e.g., the Linux® kernel feature "ZRAM") uses part of the memory as compressed block storage to avoid paging to the storage device 521. Paging takes place in the compressed block until it is necessary to write such data to the storage device 521. Virtual memory compression increases the usable size of memory 504, while reducing wear on the storage device 521.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 524 may further be transmitted or received over a communications network 526 using a transmission medium via the network interface device 520 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 520 may include one or more physical jacks (e.g., Ethernet, coaxial, or phone jacks) or one or more antennas to connect to the communications network 526. In an example, the network interface device 520 may include a plurality of antennas to wirelessly communicate using at least one of single-input multiple-output (SIMO), multiple-input multiple-output (MIMO), or multiple-input single-output (MISO) techniques.

Figure 6:
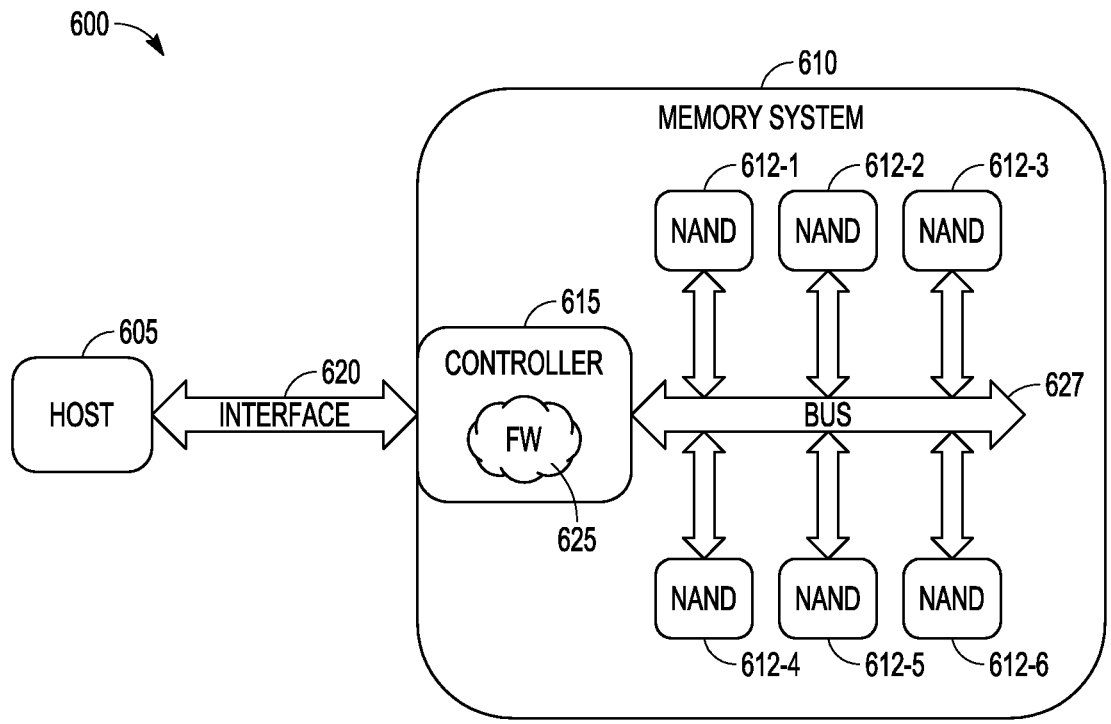
FIG. 6 is a block diagram illustrating an example system having a host coupled to a memory system, according to various embodiments.

FIG. 6 is a block diagram of a system 600 comprising a host 605 and a memory system 610. The host 605 is coupled to the memory system 610 by an interface 620. The memory system 610 can include a controller 615 coupled to memory devices 612-1, 612-2, 612-3, 612-4, 612-5, and 612-6 by a bus 627. Though six memory devices are shown in FIG. 6, the memory system 610 can be implemented with less or more than six memory devices, that is memory system 610 can comprise one or more memory devices. The controller 615 can include or be structured as one or more processors. The controller 615 can comprise firmware 625 having code to at least manage the memory devices 612-1, 612-2, 612-3, 612-4, 612-5, and 612-6. Alternatively, the firmware 625 can reside in the memory system 610 separate but coupled to the controller 615, or can be distributed in the memory system 610 with firmware components, such as but not limited to code, including one or more components in the controller 615. The firmware 625 can include code having instructions, executable by the controller, to operate on the memory devices 612-1, 612-2, 612-3, 612-4, 612-5, and 612-6. The instructions can include instructions to execute algorithms to perform one or more types of multiple block erases, as taught herein.

The system 600 and its components can be structured in a number of different arrangements. For example, the system 600 can be arranged with a variation of the type of components that comprise the host 605, the interface 620, the memory system 610, the memory devices 612-1, 612-2, 612-3, 612-4, 612-5, and 612-6, the controller 615, and the bus 627. The host 605 can comprise one or more processors, which can vary in type. The interface 620 can be arranged as, but not limited to, a peripheral component interconnect express (PCIe) interface. The memory system 610 can be, but is not limited to, a SSD. The memory devices 612-1, 612-2, 612-3, 612-4, 612-5, and 612-6 can be NAND memory devices. The controller 615 can include or be structured as one or more types of processors compatible with the memory devices 612-1, 612-2, 612-3, 612-4, 612-5, and 612-6. The bus 627 can be an ONFI bus for the memory devices 612-1, 612-2, 612-3, 612-4, 612-5, and 612-6 being NAND flash memory devices.

In various embodiments, the firmware 625 can have instructions, executable by the controller 615, to operate on a memory device of the memory devices 612-1, 612-2, 612-3, 612-4, 612-5, and 612-6, which can be extended to combinations of the memory devices, where the instructions can include operations to generate a set of initial parameters for erasing multiple blocks of memory of the memory device, and to perform an erase and verify operation on the multiple blocks.

In various embodiments, the erase and verify operation can be performed by sequentially erasing and verifying each block of the multiple blocks in response to reception by the controller 615 of a command to perform the erase and verify operation on the multiple blocks. The command can be a single command having associated therewith an identification of the multiple blocks to be erased. Host 605 can be arranged to be operable to generate the command operatively received by the controller 615, and the communication interface 620 is arranged for transmission of the command from the host 605 to the controller 615.

The operations based on the instructions in the firmware 625 for the sequential erasing and verifying operation can include instructions with respect to multiple blocks of memory identify in a list, in a range, or as all user designated memory blocks. The operations to generate the set of initial parameters can include: identification of the multiple blocks as entries in a list of blocks, the list having a number of blocks; identification of a first block of the number of blocks to erase; and generation of a count limit equal to the number of blocks to erase.

The operations to perform the erase and verify operation can include: generation of an erase pulse followed by a verify pulse for each block of the list prior to proceeding to a next block of the list, beginning with the first block; increase of a count of a block counter, by one, after erasure and verification of each block; and termination of the erase and verify operation on the multiple blocks when the count of the block counter is greater than the count limit. The operations based on the instructions in the firmware 625 for the sequential erasing and verifying operation can include instructions with respect to multiple blocks of memory identify in a list, in a range, or as all user designated memory blocks. The operations to generate the set of initial parameters can include: identification of the multiple blocks as entries in a list of blocks, the list having a number of blocks; identification of a first block of the number of blocks to erase; and generation of a count limit equal to the number of blocks to erase.

The operations to perform the erase and verify operation can include: generation of an erase pulse followed by a verify pulse for each block of the list prior to proceeding to a next block of the list, beginning with the first block; increase of a count of a block counter, by one, after erasure and verification of each block; and termination of the erase and verify operation on the multiple blocks when the count of the block counter is greater than the count limit.

The operations to generate the set of initial parameters in the sequential erasing and verifying operation can include an identification of a first block of contiguous blocks as a starting block to erase the multiple blocks and an identification of a second block of the contiguous blocks as an ending block in erasure of the multiple blocks. The operations to perform the erase and verify operation in the sequential erasing and verifying operation include generation of an erase pulse followed by a verify pulse for each block of the contiguous blocks prior to proceeding to a next block of the contiguous blocks, and termination of the erase and verify operation after erasure of the second block.

The operations to generate the set of initial parameters in the sequential erasing and verifying operation can include an identification of a chip erase operation with a start block in the sequential erasure being block zero and an end block in the sequential erasure being a last block of the memory device. The block zero and the end block can be correlated to user accessible memory blocks.

In various embodiments, the firmware 625 can have instructions, executable by the controller 615, to operate on a memory device of the memory devices 612-1, 612-2, 612-3, 612-4, 612-5, and 612-6, which can be extended to combinations of the memory devices, where the instructions can include operations to generate a set of initial parameters for erasure of multiple blocks of the memory device; provide, simultaneously, an erase pulse to each block of the multiple blocks; and verify serially, after the erase pulse is issued, erasure of each block of the multiple blocks.

The generation of the set of initial parameters can include identification for the multiple blocks for erasure in a number of different formats that can support approaches to conducting the erasure operations. The generation of the set of initial parameters can include identification of the multiple blocks for erasure as a list of blocks. The generation of the set of initial parameters can include identification of a first block as a starting block of contiguous blocks to erase the multiple blocks and identification of a second block of the contiguous blocks as an ending block of the erasure of the multiple blocks. The generation of the set of initial parameters can include identification of a chip erase operation with a start block in the erasure being block zero and an end block being a last block of the memory device. The block zero and the end block can be correlated to user accessible memory blocks.

The operations can include operations to set, in response to a determination that a block of the multiple blocks passed verification, the block as unavailable for reception of another erase pulse in the erasure of the multiple blocks. The operations can include operations to tag, as a bad block, each block that passes verification after erase to make the respective block unavailable for reception of another erase pulse. The operations can include an iterative procedure to: maintain blocks that failed verification after erase as available blocks for reception of another erase pulse; generate an additional erase pulse to the available blocks and serially verify the available blocks after generation of the additional erase pulse; and tag, as a bad block, each available block that passes verification after the additional erase pulse as unavailable for reception of another additional erase pulse. The iterative procedure can end upon a determination that each block of the multiple blocks is tagged as a bad block or upon a determination that a maximum loop count of the iterative procedure is reached.

The firmware 625 can include instructions to identify multiple blocks for erasure in a number of different formats, such as, but not limited to, the different formats discussed herein. The firmware 625 can include instructions, which respect to each of the different formats of identifying multiple blocks of memory to erase, to perform erase operations in a sequential erase and verify approach, to perform erase operations in a parallel erase and serial verify approach, and in a chip erase approach. The firmware 625 can include one or more parameters, which can operate as selection options to selectively choose the format for presentation of the multiple blocks for erasure and to selectively choose the algorithm for the erasure option. These parameters, which can be stored in memory system 610, allow the firmware 625 to direct erasure of different sets of multiple blocks using different approaches, defined by the stored code for different algorithms, executed by the controller 615. The multiple blocks can be multiple blocks on one or more memory devices of memory system 610.

Figure 7:
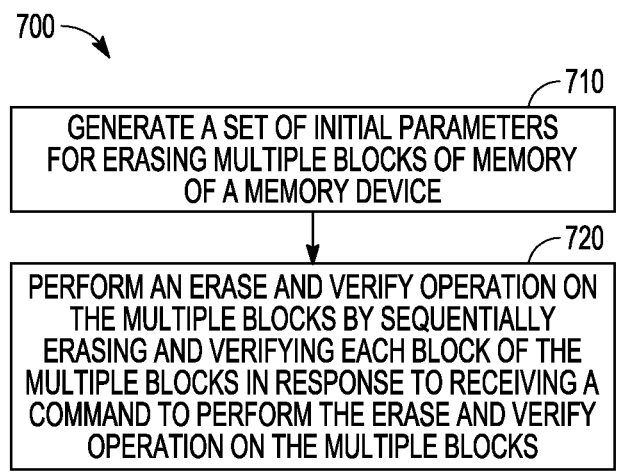
FIG. 7 is a flow diagram of features of an example method of erasing multiple blocks of memory of a memory device, according to various embodiments.

FIG. 7 is a flow diagram of features of an embodiment of an example method 700 of erasing multiple blocks of memory of a memory device. The method 700 can be performed via instructions in firmware for and executed by a controller of a memory system. The controller can be or can include one or more processors. The controller can be arranged as a memory controller for the memory device or for the memory device and other memory devices in the memory system. The method 700 or methods similar to the method 700 can be conducted with respect to blocks of memory of a memory device of a system associated with any of FIGS. 1-6.

At 710, a set of initial parameters for erasing multiple blocks of memory of a memory device is generated. At 720, an erase and verify operation is performed on the multiple blocks by sequentially erasing and verifying each block of the multiple blocks in response to receiving a command to perform the erase and verify operation on the multiple blocks.

Variations of the method 700 or methods similar to the method 700 can include a number of different embodiments that may be combined depending on the application of such methods and/or the architecture of systems in which such methods are implemented. Such methods can include generating the set of initial parameters to include identifying the multiple blocks as entries in a list of blocks, where the list has a number of blocks; identifying a first block of the number of blocks to erase and verify; and generating a count limit equal to the number of blocks to erase and verify. An erase pulse can be generated followed by a verify pulse for each block of the list prior to proceeding to a next block of the list, where the erase and verify operation begins with the first block. Such a method can include increasing a count of a block counter, by one, after erasing and verifying each block; and terminating the erase and verify operation when the count of the block counter is greater than the count limit.

Variations of the method 700 or methods similar to the method 700 can include generating the set of initial parameters to include identifying a first block of contiguous blocks as a starting block to erase and verify the multiple blocks and identifying a second block of the contiguous blocks as an ending block in erasure and verification of the multiple blocks. An erase pulse can be generated followed by a verify pulse for each block of the contiguous blocks prior to proceeding to a next block of the contiguous blocks. The erase and verify operation can be terminated after erasing the second block.

Variations of the method 700 or methods similar to the method 700 can include generating the set of initial parameters to include identifying a chip erase operation with a start block in the sequential erasing and verifying being block zero and an end block being a last block of the memory device.

Figure 8:
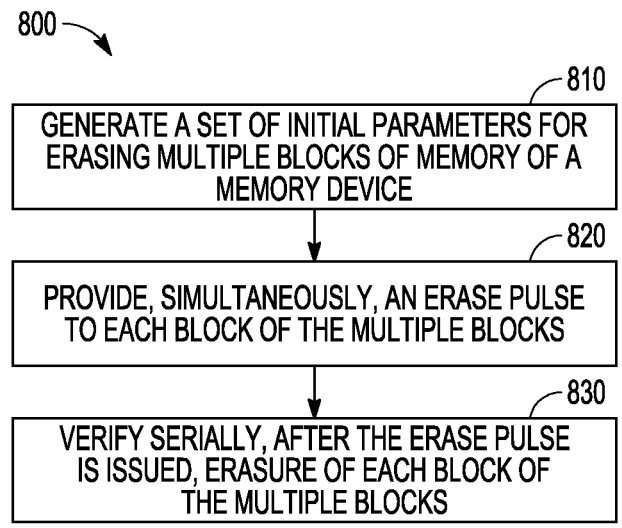
FIG. 8 is a flow diagram of features of an example method of erasing multiple blocks of memory of a memory device, according to various embodiments.

FIG. 8 is a flow diagram of features of an embodiment of an example method 800 of erasing multiple blocks of memory of a memory device. The method can be performed via instructions in firmware for and executed by a controller of a memory system. The controller can be or can include one or more processors. The controller can be arranged as a memory controller for the memory device or for the memory device and other memory devices in the memory system. The method 800 or methods similar to the method 800 can be conducted with respect to blocks of memory of a memory device of a system associated with any of FIGS. 1-6.

At 810, a set of initial parameters is generated for erasing multiple blocks of memory of a memory device. At 820, an erase pulse is provided, simultaneously, to each block of the multiple blocks. At 830, after the erase pulse is issued, erasure of each block of the multiple blocks is verify serially.

Variations of the method 800 or methods similar to the method 800 can include a number of different embodiments that may be combined depending on the application of such methods and/or the architecture of systems in which such methods are implemented. Such methods can include generating the set of initial parameters to include identifying the multiple blocks for erasure in a list of blocks. Such methods can include generating the set of initial parameters to include identifying a first block of contiguous blocks as a starting block to erase the multiple blocks and identifying a second block of the contiguous blocks as an ending block of the erasure of the multiple blocks. Such methods can include generating the set of initial parameters to include identifying a chip erase operation with a start block in the sequential erasing being block zero and an end block being a last block of the memory device.

Variations of the method 800 or methods similar to the method 800 can include setting, in response to a determination that a block of the multiple blocks passed verification, the block as unavailable for reception of another erase pulse in the erasure of the multiple blocks. Such methods can include tagging, as a bad block, each block that passes verification after erase to make the respective block unavailable for reception of another erase pulse after passing the verification. Such methods having a tagging process can include conducting an iterative procedure, where the iterative procedure includes: maintaining blocks that failed verification after erase as available blocks for reception of another erase pulse; generating an additional erase pulse to the available blocks and serially verifying the available blocks after generation of the additional erase pulse; and tagging, as a bad block, each available block that passes verification after the additional erase pulse as unavailable for reception of another additional erase pulse. The iterative procedure can end upon determining that each block of the multiple blocks is tagged as a bad block or determining that a maximum loop count of the iterative procedure is reached.

Figure 9:
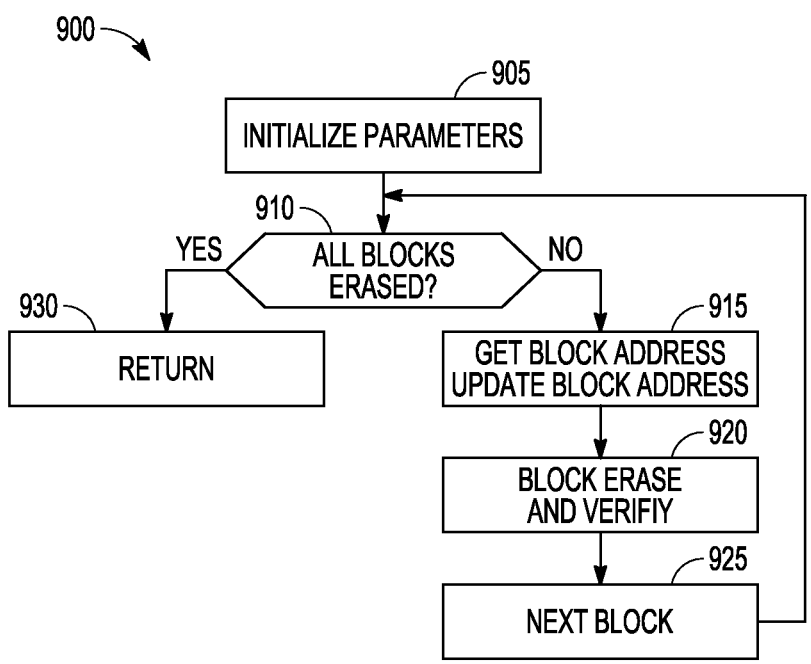
FIG. 9 is a flow diagram of features of an example method of erasing multiple blocks of memory of a memory device in a sequential manner, according to various embodiments.

FIG. 9 is a flow diagram of features of an embodiment of an example method 900 of erasing multiple blocks of memory of a memory device in a sequential manner. The erasure of the multiple blocks can be conducted following reception of a command at a memory system, for example, at the memory system 610 from the host 605 illustrated in FIG. 6. The received command can be a single command with associated control signals for erasing multiple blocks without receiving further commands with respect to erasing these multiple blocks. The erasure procedure, following the reception of the command, can be executed using an algorithm stored in firmware and executed by a controller of the memory system, for example, such an algorithm can be stored in the FW 625 and executed by the controller 615 of FIG. 6.

At 905, parameters for the erase operation are initialized. Internal variables are initialized with the start and stop limits or with the address in a list of multiple blocks to be erased. The identity of the multiple blocks can be provided with the command to execute the erase. The initialization can also include arranging the erase operation on the multiple blocks to use a sequential erase and verify algorithm and/or selecting use of RMBE, LMBE, or CE. In RMBE, a start block address and a stop block address can be identified to define a start and a stop for the RMBE operation. In LMBE, the list of memory blocks to be erased is identified and the number of blocks in the list are determined and a block counter established with the number of blocks set as a threshold to define an end of the erase operation using the block counter. In CE, in the algorithm stored in the firmware, the algorithm considers the memory blocks that are allocated as user memory, which can have memory addresses starting from a zero block to a last block. In the sequential erase operation, the starting block for erasing can be set equal to the zero block of the user blocks and the end block can be set equal to the last block of the user blocks. The last block of the user blocks can be hardcoded in the firmware. When running CE, since all user blocks are being erased, the host is independent from NAND geometry, that is, the number of bocks.

After the parameters are initialized with the sequential erase and verify approach selected, the execution of the algorithm proceeds in an algorithmic loop on the blocks included in the list, in the range, or for all the user blocks. Since the identity of the multiple blocks is provided to the memory system by an external device or apparatus for RMBE or LMBE, the list or range can be termed a user list or user range.

At 910, a determination is made as to whether all the blocks of the user list, all blocks of the range, or all user blocks have been erased depending on the use of RMBE, LMBE, or CE. If the determination is yes that all the blocks are erased, at 930, the execution of the sequential erase and verify algorithm ends and the processor returns to performing other functions of the memory system, which may include additional multiple block erases or a chip erase in response to another command received. During the erasure operation in a memory device, the processor may be executing other functions for the memory device or functions for other memory devices in a memory system in which the memory device is located. If the determination is no, the processor proceeds to execute the loop of the selected algorithm. In some embodiments, the selected algorithm is a de facto selection if this algorithm is the only MBE algorithm in the firmware of the memory system. On initial pass through the loop, the block to be operated in the first block in the range in the order in which the range is processed or the first block is correlated to the beginning of the block counter.

At 915, the identity of the block address of the current block to be processed is obtained from the list or range and this current block for processing is updated. The updating of the current block can include tagging this current block and/or removing the previously processed block from the list or the range (for CE, the range is all the user blocks). At 920, the block having the current block address is erased, and this block is verified before proceeding to the next block in the list or range.

At 925, a next block for possible processing is labeled and the loop proceeds to 910. For RMBE, a block address equal to the next block address in the memory can be generated and used in further erasing of blocks of the multiple blocks or as a break condition in processing the loop. For LMBE, the block counter can be updated to be used to identify the next block to process or as a break condition in processing the loop. For CE, a block address equal to the next block address in the memory can be generated and used in further erasing of blocks of the multiple blocks or as a break condition in processing the loop. For CE, if the currently erased block is the last block, the next block can be set to the last block address or set to an address beyond the last block address even though the memory may not have this address or if there are block addresses in the memory that are greater the address for the last block of the user blocks, the next block can be set to the address beyond the address for the last user block.

At 910, a determination is made as to whether all the blocks of the user list, all blocks of the range, or all user blocks have been erased depending on the use of RMBE, LMBE, or CE, as part of the iterative process in the loop. This determination provides the break condition to exit the loop. For a RMBE, the break condition is the determination that the actual block set in the loop at 925 is greater than the end block in the identified range of the multiple blocks being erased. That is, a pointer for the blocks in the range points outside the range from the setting of the next block at 925. For LMBE, the break condition occurs when the count in the block counter set at 925 is greater than the threshold count set at initialization, where the threshold is the number of block entries in the list of block entries. For a CE, the break condition is the determination that the actual block set in the loop at 925 is the last block of the user blocks or an address greater than the address for the last user block.

Figure 10:
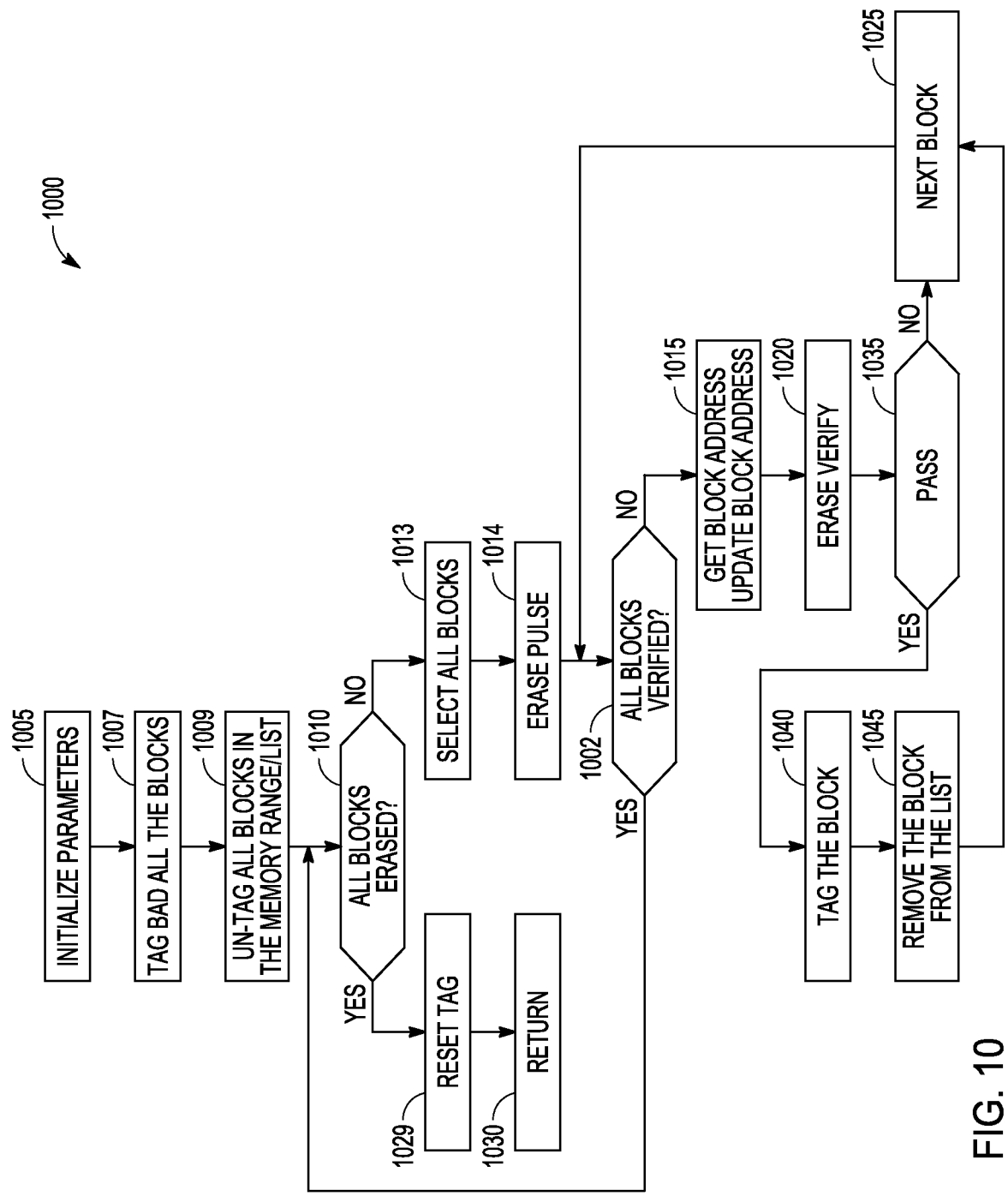
FIG. 10 is a flow diagram of features of an example method of erasing multiple blocks of memory of a memory device having a parallel erase operation, according to various embodiments.

FIG. 10 is a flow diagram of features of an embodiment of an example method 1000 of erasing multiple blocks of memory of a memory device having a parallel erase operation. The erasure of the multiple blocks can be conducted following reception of a command at a memory system, for example, at the memory system 610 from the host 605 illustrated in FIG. 6. The received command can be a single command with associated control signals for erasing multiple blocks without receiving further commands with respect to erasing these multiple blocks. The erasure procedure, following the reception of the command, can be executed using an algorithm stored in firmware and executed by a controller of the memory system, for example, such an algorithm can be stored in the FW 625 and executed by the controller 615 of FIG. 6.

In an embodiment including a parallel erase operation, an erase pulse can be applied simultaneously to a bunch of blocks, which are the multiple blocks designated for erasure, so that these blocks are erased in parallel. After the erase pulse is issued, the blocks can be verified serially. Serial verification is a process in which the blocks are verified one by one from a starting block to an end block. Blocks that pass the verification can be prevented from receiving another erase pulse for verification. Blocks that pass the erase verify can be tagged as bad. This allows the use of a block disable latch (BDL) in the parallel erase operation, similar to some processes in which unselected blocks, such as bad blocks, are disabled from being written to or read from in a user operation. For these blocks that pass the erase verify, the BDL can be set for each such block and the block behaves like an unselected block, in which these blocks do not receive another erase pulse that is issued to blocks that do not pass verification. Moreover, the passing blocks may remain in the verify loop, since their BDL state, for example BDL=1, does not allow action on these blocks.

Blocks of the set of originally identified multiple blocks that do not pass their erase verify processing can be given another erase pulse. If one or more BDLs are still zero, allowing operations to access their corresponding blocks, the algorithm can keep looping, where looping includes application of the erase pulse plus erase verify. The algorithm for parallel erase and serial verify can end when all the BDLs are set to a disable output state or when a maximum loop count is reached, which can define a break condition for the algorithm. If the algorithm ends due to a time-out condition, a failing block can be retrieved by reading back their BDL information.

At 1005, parameters for the erase operation are initialized. Internal variables are initialized with the start and stop limits or with the address in a list of multiple blocks to be erased. The identity of the multiple blocks can be provided with the command to execute the erase. These limits can be used in the serial verify portion of the operation selected for the erase operation on the multiple blocks. The initialization can select the use of RMBE, LMBE, or CE. In RMBE, a start block address and a stop block address can be identified to define the start and a stop of a range of blocks for the RMBE operation. In LMBE, the list of memory blocks to be erased are identified. In CE, the algorithm considers the memory blocks that are allocated as user memory, which can have memory addresses starting from a zero block to a last block. In CE, the starting block for erasing can be set equal to the zero block of the user blocks and the end block can be set equal to the last block of the user blocks. The last block of the user blocks can be hardcoded in the firmware.

At 1007, all the blocks are tagged as bad, where the blocks are user blocks. In CE, tagging all the blocks as bad can be skipped, since all blocks are being erased. At 1009, all the blocks in the list of the multiple blocks or in the range of the multiple blocks are un-tagged. Skipping the tag procedure in CE results in all the blocks being un-tagged. The combination of the operations at 1007 and 1009 provide for the memory blocks of the memory device that are not in the list or in the range for erasure to be unselected for memory operations during execution of the parallel erase/serial verify algorithm. The tag of memory block provides an input signal to a BDL for the memory block that unselects the memory block for a memory operation. For example, a BDL for a tagged memory block can have a value of one to be in the unselected state, similar to a bad block state in other processes for the memory device.

At 1010, determination is made as to whether all the blocks of the user list, all blocks of the range, or all user blocks have been erased. The determination can be based on a determination as to whether all the BDLs of all the memory blocks that were untagged at 1009 are now in the tagged state, which can correspond to the BDL equal to one. Alternatively, the BDL can be structured as a logic circuit providing the unselected state to correspond to a zero. All the BDLs in the tagged state provides a break condition for the algorithm loops. If the determination is yes that all the blocks are erased, the processor, executing the algorithm stored in the firmware, can begin operations to end the algorithm. The ending of the algorithm can also be initiated by a break condition set to the algorithm reaching a maximum loop count. To begin the end of the erasure process, upon determination that all blocks identified for erasure have been erased, the tags on all the blocks on the memory device can be reset at 1029. With the reset at 1029 un-tagging the memory blocks, all memory blocks of the memory are placed in condition for normal use as memory blocks. From 1019, execution of the parallel erase and serial verify algorithm ends and the processor returns to performing other functions of the memory system, at 1030, which may include additional multiple block erases or a chip erase in response to another command received. During the erasure operation in a memory device, the processor may be executing other functions for the memory device or functions for other memory devices in a memory system in which the memory device is located.

If the determination is no at 1010, the processor proceeds to execute the loop of the selected parallel erase/serial verify algorithm. In some embodiments, the selected algorithm is a de facto selection if this algorithm is the only MBE algorithm in the firmware of the memory system. At 1013, all blocks of the memory are selected. At 1014, an erase pulse is applied. Though all blocks are selected at 1013, only the untagged blocks receive the erase pulse that is applied in parallel to the untagged blocks. Following the parallel applied erase pulse, a determination is made at 1002 as to whether all the blocks receiving the erase pulse have been verified. If the determination is yes, the algorithm checks again at 1010 whether all blocks are erased.

If the determination is no, at 1002, with respect to the determination whether all blocks have been verified, at 1015 the block address of the current block to be processed is obtained from the list or the range and this current block for processing is updated. At 1020, the block having the current block address is subjected to an erase verify. At 1035, a determination is made as to whether the block at the current block address passed the erase verification.

If the determination at 1035 is yes that the current block passed the erase verification, the current block is tagged such that the current block will not be subjected to erase verification. The current block can be tagged as a bad block. After to the current block is tagged, the current block can be removed from a list for being subjected to erase verify, at 1045. From 1045, the next block in the list can be selected to continue the verify processing, at 1025. From 1025, the algorithm can again determine if all the blocks are verified, at 1002.

If the further determination at 1002 is yes, then the iterative procedure can determine again if all the blocks are erased at 1010. If the further determination at 1002 is no, then the iterative procedure proceeds again to getting the next block address and updating the next block address at 1015 as the current block address for erase verify at 1020 and for determination as whether the erase verify is successful at 1035.

Figure 11:
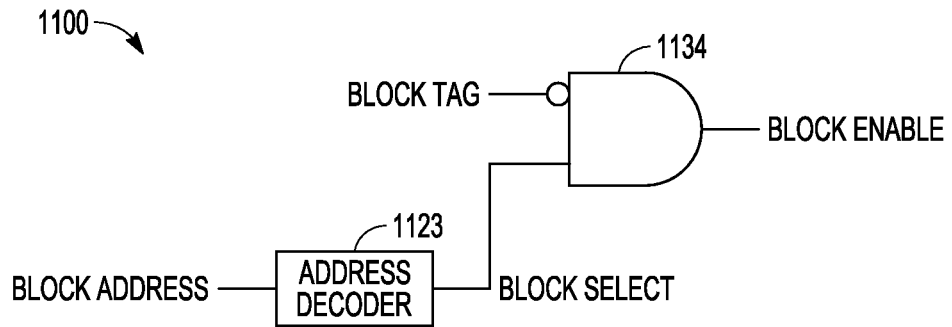
FIG. 11 is a block illustrating an embodiment of a block disable latch, according to various embodiments.

FIG. 11 is a block illustrating an embodiment of a block disable latch 1100 for use in a parallel erase/serial verification algorithm to erase multiple blocks. Block disable latch 1100 can include an AND logic gate 1134 to receive an inverted value of a block tag of a block from execution of a successful erase verify on the block following application of an erasure pulse to multiple blocks. The AND logic gate 1134 can have an input to receive a block select from an address decoder 1123. The block address, corresponding to the block tag input to AND logic gate 1134, is provided to the address decoder 1123 to generate the block select to AND logic gate 1134. AND logic gate 1134 can output a block enable signal having one of two values, where one value disables the block and the other value enables the block to engage in a memory operation.

Figure 12:
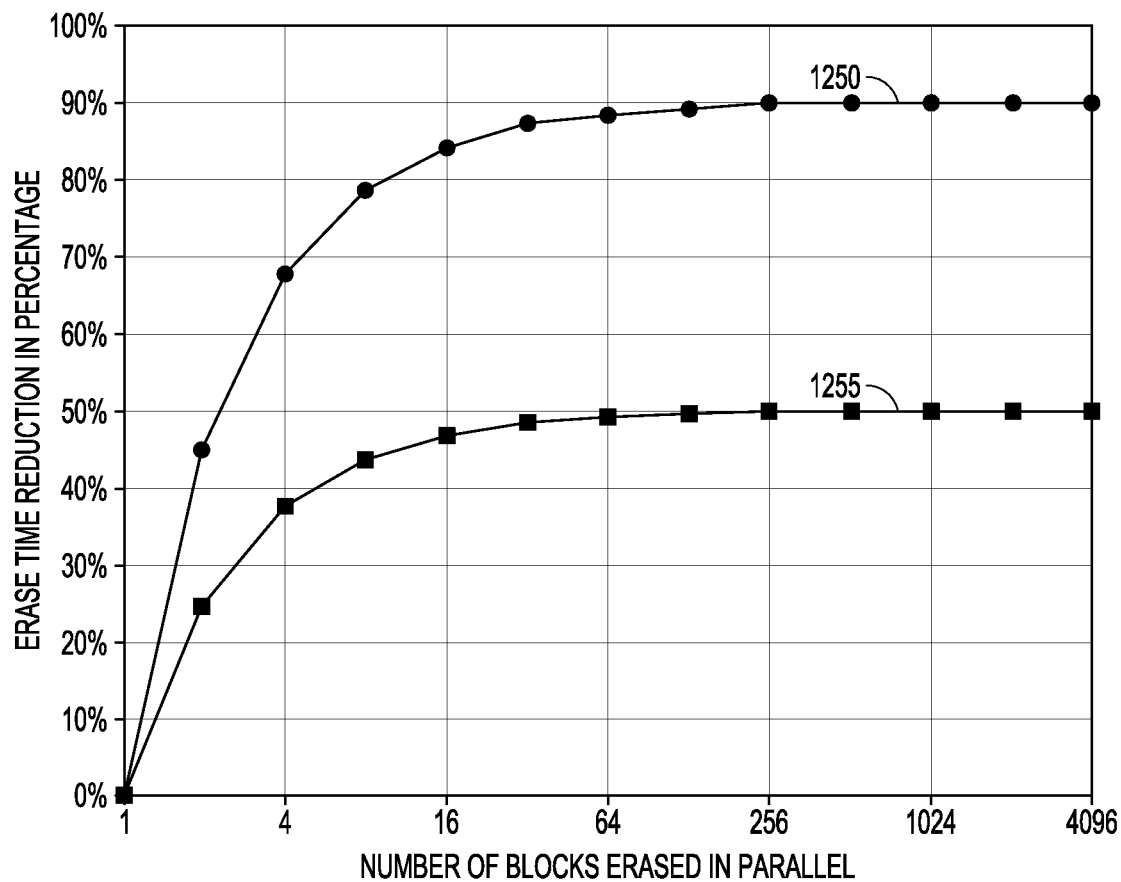
FIG. 12 is a simulation of erase time for two different types of memory components using an example method of erasing multiple blocks of memory of a memory device having a parallel erase operation, according to various embodiments.

FIG. 12 is a simulation of erase time for two different types of memory components using an example method of erasing multiple blocks of memory of a memory device having a parallel erase operation. Curve 1250 shows erase time reduction in percentage versus the number of blocks erased in parallel for a replacement gate NAND. Curve 1255 shows erase time reduction in percentage versus the number of blocks erased in parallel for a floating gate NAND. The erase time saving tends to the ratio tPULSE/tBERS, where tPULSE is the pulse width of the erase pulse and the tBERS is the time for block erase. It is assumed that tBERS≅tPULSE+tVFY, where tVFY is the time to erase verify.

Figure 13:
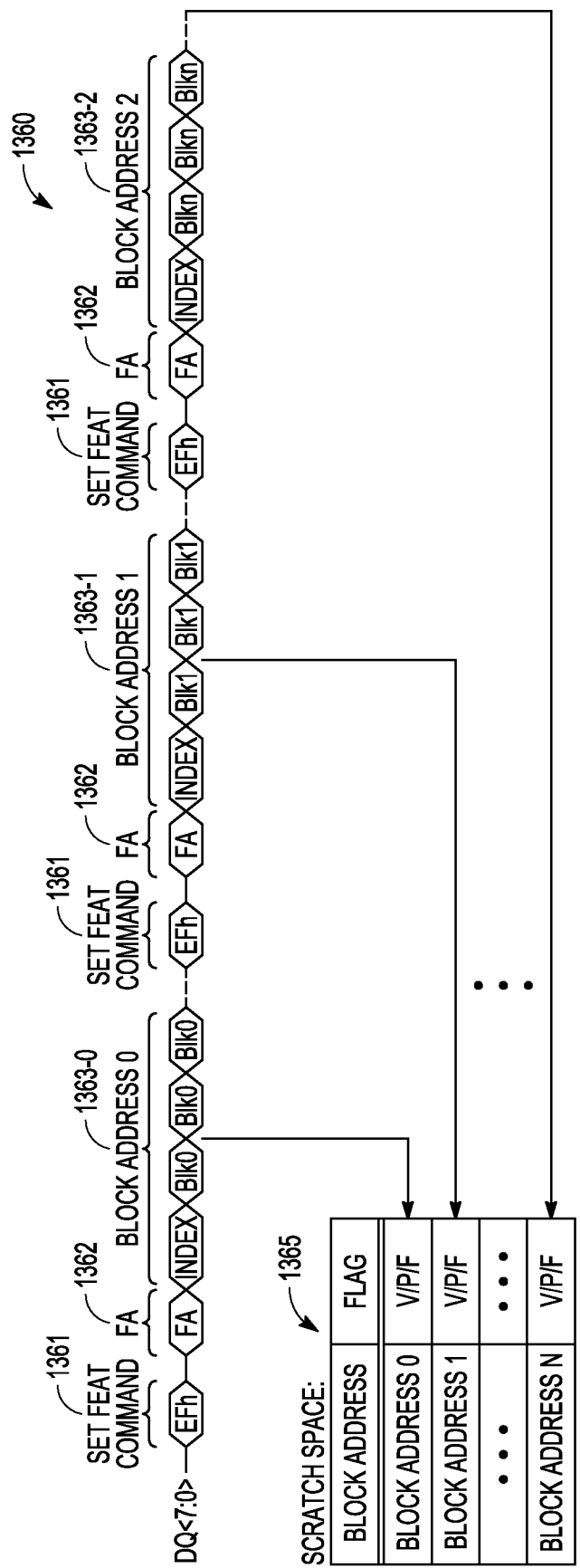
FIG. 13 is an illustration of an example command structure for a list multiple block erase, according to various embodiments.

FIG. 13 is an illustration of an embodiment of an example command structure 1360 for a list multiple block erase. Example command structure 1360 can include the block addresses of a number N of blocks to be erased, where N is an integer greater than or equal to 2. In the example command structure 1360, each block address slot 1363-0, 1363-1, 1363-2 . . . is preceded by a set feature command field 1361 and a feature address field 1362, which separates the block addresses from each other. A feature address (FA) is an address identifying a feature to modify or return parameters using a set or get feature command, respectively.

Figure 14:
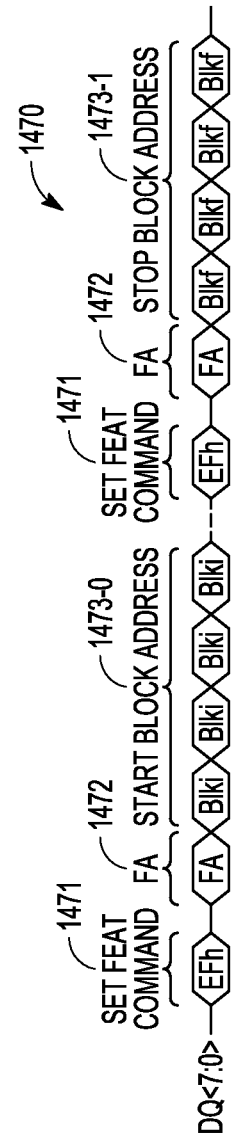
FIG. 14 is an illustration of an example command structure for a range multiple block erase, according to various embodiments.

By using the set feature command, a user, such as the host 605 of FIG. 6 or other device, that generates data to a memory system, such as the memory system 610, can populate a scratch space 1365 in the memory system with the list of blocks to be erased. The scratch space 1365 includes a status flag. A set flag (SETF) command for a given address in the list can be used to initialize the status flag to valid (V) to communicate that the given address is valid and the block, corresponding to this given address, is to be erased. The LMBE algorithm implemented can update the status flag to pass (P) or to fail (F) for the given address based on the result of the erase operation on the given address. At the end of the algorithm executed by a processor with respect to instructions stored as code for multiple erase of blocks of memory in firmware, the host can retrieve the erase result of the erase operation on the blocks of memory by accessing the scratch space 1365 with a get feature command FIG. 14 is an illustration of an embodiment of an example command structure 1470 for a range multiple block erase. The example command structure 1470 can include the block addresses of a start block and a stop block defining the range of blocks to be erased. In the example command structure 1470, the block address slots 1473-0 and 1473-1 are preceded by a set feature command field 1471 and a feature address field 1472.

By using the set feature command, a user, such as the host 605 of FIG. 6 or other device, that generates data to a memory system, such as the memory system 610, can populate a scratch space in the memory system with the results from the erase operation on the multiple blocks defined by the range according to the start block address and the stop block address. After the last verify operation, a scratch space can be populated with block addresses of failing blocks by executing instructions for the erase algorithm for multiple blocks stored as code in the firmware of the memory system. If the number of fails exceeds the size of the scratch space, a flag can be set to a special value. This may be an extreme case where the memory device is broken, or the operative conditions are out of specification and these blocks addresses of the failing blocks are useless for error handling. At the end of the multiple block erase algorithm, the host can retrieve the erase result by accessing the scratch space with get feature command.

Firmware can comprise instructions, such as a microcode, which, when executed by a controller or a processor, can cause performance of operations comprising operations associated with multiple block erase operations of a memory device of a memory system coupled to a host as associated with any of the FIGS. 1-6, the methods 700-1000, methods similar to the methods 700-1000, other methods, and associated device structures and data structures as taught herein.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.).

According to one or more embodiments, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

Method examples described herein can be machine-implemented or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer-readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The following are example embodiments of methods, apparatus, and systems, in accordance with the teachings herein.

An example system 1 can comprise: a controller; a memory device; and firmware having stored instructions, executable by the controller, to operate on the memory device, the instructions including operations to: generate a set of initial parameters for erasing multiple blocks of memory of the memory device; and perform an erase and verify operation on the multiple blocks by sequentially erasing and verifying each block of the multiple blocks in response to reception by the controller of a command to perform the erase and verify operation on the multiple blocks.

An example system 2 can include features of example system 1 and can include the operations to generate the set of initial parameters to include an identification of a first block of contiguous blocks as a starting block to erase the multiple blocks and an identification of a second block of the contiguous blocks as an ending block in erasure of the multiple blocks.

An example system 3 can include features of any of the preceding example systems and can include the operations to perform the erase and verify operation to include generation of an erase pulse followed by a verify pulse for each block of the contiguous blocks prior to proceeding to a next block of the contiguous blocks, and termination of the erase and verify operation after erasure of the second block.

An example system 4 can include features of any of the preceding example systems and can include the operations to generate the set of initial parameters to include: identification of the multiple blocks as entries in a list of blocks, the list having a number of blocks; identification of a first block of the number of blocks to erase; and generation of a count limit equal to the number of blocks to erase.

An example system 5 can include features of any of the preceding example systems and can include: generation of an erase pulse followed by a verify pulse for each block of the list prior to proceeding to a next block of the list, beginning with the first block; increase of a count of a block counter, by one, after erasure and verification of each block; and termination of the erase and verify operation on the multiple blocks when the count of the block counter is greater than the count limit.

An example system 6 can include features of any of the preceding example systems and can include the operations to generate the set of initial parameters to include an identification of a chip erase operation with a start block in the sequential erasure and verification being block zero and an end block in the sequential erasure being a last block of the memory device.

An example system 7 can include features of any of the preceding example systems and can include the system being a solid-state drive.

An example system 8 can include features of any of the preceding example systems and can include the system includes: a host operable to generate the command operatively received by the controller; and a communication interface coupled to the host and to the controller, the communication interface arranged for transmission of the command from the host to the controller.

An example method 1 can comprise: generating a set of initial parameters for erasing multiple blocks of memory of a memory device; and performing an erase and verify operation on the multiple blocks by sequentially erasing and verifying each block of the multiple blocks in response to receiving a command to perform the erase and verify operation on the multiple blocks.

An example method 2 can include features of example method 1 and can include generating the set of initial parameters to include identifying a first block of contiguous blocks as a starting block to erase and verify the multiple blocks and identifying a second block of the contiguous blocks as an ending block in erasure and verification of the multiple blocks.

An example method 3 can include features of any of the preceding example methods and can include performing the erase and verify operation to include generating an erase pulse followed by a verify pulse for each block of the contiguous prior to proceeding to a next block of the contiguous blocks, and terminating the erase and verify operation after erasing the second block.

An example method 4 can include features of any of the preceding example methods and can include generating the set of initial parameters to include: identifying the multiple blocks as entries in a list of blocks, the list having a number of blocks; identifying a first block of the number of blocks to erase and verify; and generating a count limit equal to the number of blocks to erase and verify.

An example method 5 can include features of any of the preceding example methods and can include performing the erase and verify operation to include: generating an erase pulse followed by a verify pulse for each block of the list prior to proceeding to a next block of the list, beginning with the first block; increasing a count of a block counter, by one, after erasing and verifying each block; and terminating the erase and verify operation when the count of the block counter is greater than the count limit.

An example method 6 can include features of any of the preceding example methods and can include generating the set of initial parameters to include identifying a chip erase operation with a start block in the sequential erasing and verifying being block zero and an end block being a last block of the memory device.

An example system 9 can comprise: a controller; a memory device; and firmware having stored instructions, executable by the controller, to operate on the memory device, the instructions including operations to: generate a set of initial parameters for erasure of multiple blocks of memory of the memory device; provide, simultaneously, an erase pulse to each block of the multiple blocks; and verify serially, after the erase pulse is issued, erasure of each block of the multiple blocks.

An example system 10 can include features of example system 9 and can include operations to set, in response to a determination that a block of the multiple blocks passed verification, the block as unavailable for reception of another erase pulse in the erasure of the multiple blocks.

An example system 11 can include features of any of the preceding example systems 9 and 10 and can include the operations to include operations to tag, as a bad block, each block that passes verification after erase to make the respective block unavailable for reception of another erase pulse.

An example system 12 can include features of any of the preceding example systems 9-11 and can include the operations to include an iterative procedure to: maintain blocks that failed verification after erase as available blocks for reception of another erase pulse; generate an additional erase pulse to the available blocks and serially verify the available blocks after generation of the additional erase pulse; and tag, as a bad block, each available block that passes verification after the additional erase as unavailable for reception of another additional erase.

An example system 13 can include features of any of the preceding example systems 9-12 and can include the iterative procedure to end upon a determination that each block of the multiple blocks is tagged as a bad block or upon a determination that a maximum loop count of the iterative procedure is reached.

An example system 14 can include features of any of the preceding example systems 9-13 and can include the generation of the set of initial parameters to include identification of a first block of contiguous blocks as a starting block to erase the multiple blocks and identification of a second block of the contiguous blocks as an ending block of the erasure of the multiple blocks.

An example system 15 can include features of any of the preceding example systems 9-14 and can include the generation of the set of initial parameters to include identification of the multiple blocks for erasure as a list of blocks.

An example system 16 can include features of any of the preceding example systems 9-12 and can include the generation of the set of initial parameters to include identification of a chip erase operation with a start block in the erasure being block zero and an end block being a last block of the memory device.

An example method 7 can comprise: generating a set of initial parameters for erasing multiple blocks of memory of a memory device; providing, simultaneously, an erase pulse to each block of the multiple blocks; verifying serially, after the erase pulse is issued, erasure of each block of the multiple blocks.

An example method 8 can include features of example method 7 and can include setting, in response to a determination that a block of the multiple blocks passed verification, the block as unavailable for reception of another erase pulse in the erasure of the multiple blocks.

An example method 9 can include features of any of the preceding example methods 7 and 8 and can include tagging, as a bad block, each block that passes verification after erase to make the respective block unavailable for reception of another erase pulse after passing the verification.

An example method 10 can include features of any of the preceding example methods 7 and 9 and can include conducting an iterative procedure including: maintaining blocks that failed verification after erase as available blocks for reception of another erase pulse; generating an additional erase pulse to the available blocks and serially verifying the available blocks after generation of the additional erase pulse; and tagging, as a bad block, each available block that passes verification after the additional erase pulse as unavailable for reception of another additional erase pulse.

An example method 11 can include features of any of the preceding example methods 7-10 and can include the iterative procedure ending upon determining that each block of the multiple blocks is tagged as a bad block or determining that a maximum loop count of the iterative procedure is reached.

An example method 12 can include features of any of the preceding example methods 7-11 and can include generating the set of initial parameters to include identifying a first block of contiguous blocks as a starting block to erase the multiple blocks and identifying a second block of the contiguous blocks as an ending block of the erasure of the multiple blocks.

An example method 13 can include features of any of the preceding example methods 7-12 and can include generating the set of initial parameters to include identifying the multiple blocks for erasure in a list of blocks.

An example method 14 can include features of any of the preceding example methods 7-13 and can include generating the set of initial parameters to include identifying a chip erase operation with a start block in the sequential erasing being block zero and an end block being a last block of the memory device.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Thus, the following claims are hereby incorporated into the Detailed Description, with each claim standing on its own as a separate embodiment.

What is claimed is:

1. A system comprising:
   a controller;
   a memory device; and
   firmware having stored instructions, executable by the controller, to operate on the memory device, the instructions including operations to:
      generate a set of initial parameters for erasure of multiple blocks of memory of the memory device;
      provide, simultaneously, an erase pulse to each block of the multiple blocks;
      perform verify determinations serially, after the erase pulse is issued, with respect to erasure of each block of the multiple blocks; and
      in response to a determination that a block of the multiple blocks passed verification, set the block that passed verification as unavailable for reception of another erase pulse in the erasure of the multiple blocks by tagging the block as a bad block, with tagging the block as a bad block including sending a block tag to a block disable latch for the block that passed verification such that the block disable latch outputs a block signal that disables the block that passed verification to make the block unavailable for reception of another erase pulse in the erasure of the multiple blocks.

2. The system of claim 1, wherein the operations include an iterative procedure to:
   maintain blocks that failed verification after erase as available blocks for reception of another erase pulse;
   generate an additional erase pulse to the available blocks and serially verify the available blocks after generation of the additional erase pulse; and
   tag, as a bad block, each available block that passes verification after the additional erase as unavailable for reception of another additional erase.

3. The system of claim 2, wherein the iterative procedure ends upon a determination that each block of the multiple blocks is tagged as a bad block or upon a determination that a maximum loop count of the iterative procedure is reached.

4. The system of claim 1, wherein the generation of the set of initial parameters includes identification of a first block of contiguous blocks as a starting block to erase the multiple blocks and identification of a second block of the contiguous blocks as an ending block of the erasure of the multiple blocks.

5. The system of claim 1, wherein the generation of the set of initial parameters includes identification of the multiple blocks for erasure as a list of blocks.

6. The system of claim 1, wherein the generation of the set of initial parameters includes identification of a chip erase operation with a start block in the erasure being block zero and an end block being a last block of the memory device.

7. A method comprising:
   generating a set of initial parameters for erasing multiple blocks of memory of a memory device;
   providing, simultaneously, an erase pulse to each block of the multiple blocks;
   performing verifying determinations serially, after the erase pulse is issued, with respect to erasure of each block of the multiple blocks; and
   in response to a determination that a block of the multiple blocks passed verification, setting the block that passed verification as unavailable for reception of another erase pulse in the erasure of the multiple blocks by tagging the block as a bad block, with tagging the block as a bad block including sending a block tag to a block disable latch for the block that passed verification such that the block disable latch outputs a block signal that disables the block that passed verification to make the block unavailable for reception of another erase pulse in the erasure of the multiple blocks.

8. The method of claim 7, wherein the method includes conducting an iterative procedure including:
   maintaining blocks that failed verification after erase as available blocks for reception of another erase pulse;
   generating an additional erase pulse to the available blocks and serially verifying the available blocks after generation of the additional erase pulse; and
   tagging, as a bad block, each available block that passes verification after the additional erase pulse as unavailable for reception of another additional erase pulse.

9. The method of claim 8, wherein the iterative procedure ends upon determining that each block of the multiple blocks is tagged as a bad block or determining that a maximum loop count of the iterative procedure is reached.

10. The method of claim 7, wherein generating the set of initial parameters includes identifying a first block of contiguous blocks as a starting block to erase the multiple blocks and identifying a second block of the contiguous blocks as an ending block of the erasure of the multiple blocks.

11. The method of claim 7, wherein generating the set of initial parameters includes identifying the multiple blocks for erasure in a list of blocks.

12. The method of claim 7, wherein generating the set of initial parameters includes identifying a chip erase operation with a start block being block zero and an end block being a last block of the memory device.

* * * * *